(12) United States Patent
Manfrini et al.

(10) Patent No.: US 11,177,267 B2
(45) Date of Patent: Nov. 16, 2021

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Mauricio Manfrini, Hsinchu County (TW); Sai-Hooi Yeong, Hsinchu County (TW); Han-Jong Chia, Hsinchu (TW); Chenchen Jacob Wang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/857,074

(22) Filed: Apr. 23, 2020

(65) Prior Publication Data
US 2021/0242225 A1     Aug. 5, 2021

Related U.S. Application Data

(60) Provisional application No. 62/968,018, filed on Jan. 30, 2020.

(51) Int. Cl.
| | |
|---|---|
| *H01L 27/11502* | (2017.01) |
| *G11C 11/22* | (2006.01) |
| *H01L 29/66* | (2006.01) |
| *H01L 29/78* | (2006.01) |

(52) U.S. Cl.
CPC ...... *H01L 27/11502* (2013.01); *G11C 11/221* (2013.01); *H01L 29/6684* (2013.01); *H01L 29/78391* (2014.09)

(58) Field of Classification Search
None
See application file for complete search history.

(56) References Cited

U.S. PATENT DOCUMENTS

| | | | | |
|---|---|---|---|---|
| 2004/0233610 | A1* | 11/2004 | Basceri | H01G 4/33 361/306.3 |
| 2006/0049440 | A1* | 3/2006 | Bruchhaus | H01L 27/11502 257/295 |
| 2015/0060969 | A1* | 3/2015 | Matsuura | H01L 29/516 257/295 |
| 2017/0117282 | A1* | 4/2017 | Mathur | H01L 27/11582 |

\* cited by examiner

*Primary Examiner* — Steven M Christopher
(74) *Attorney, Agent, or Firm* — WPAT, P.C., Intellectual Property Attorneys; Anthony King

(57) ABSTRACT

A semiconductor structure includes a substrate; a first dielectric layer disposed over the substrate; a transistor disposed within the first dielectric layer; a second dielectric layer disposed over the first dielectric layer; and a capacitor disposed within the second dielectric layer and electrically connected to the transistor, wherein the capacitor includes a first electrode, a dielectric stack disposed over the first electrode, and a second electrode disposed over the dielectric stack, the dielectric stack includes a ferroelectric layer and an electrostrictive layer. Further, a method of manufacturing a semiconductor structure includes disposing an electrostrictive material over a first electrode layer; disposing a ferroelectric material over the first electrode layer; removing a portion of the ferroelectric material to form the ferroelectric material; and removing a portion of the electrostrictive material to form the electrostrictive layer.

20 Claims, 14 Drawing Sheets

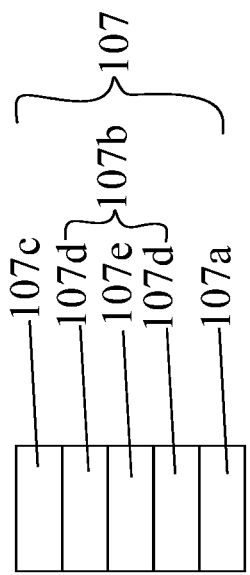
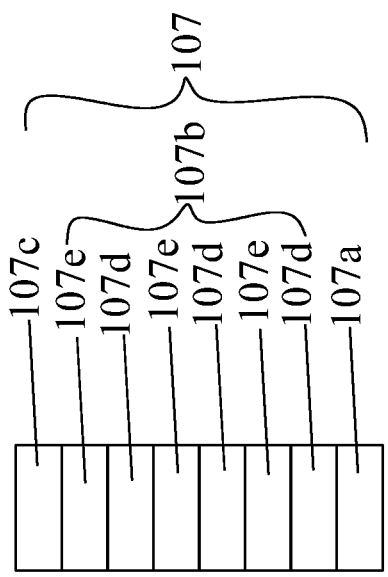

SEMICONDUCTOR STRUCTURE AND MANUFACTURING METHOD THEREOF

PRIORITY CLAIM AND CROSS-REFERENCE

This application claims the benefit of provisional application Ser. 62/968,018 filed on Jan. 30, 2020, entitled "SEMICONDUCTOR STRUCTURE AND MANUFACTURING METHOD THEREOF," the disclosure of which is hereby incorporated by reference in its entirety.

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Many modern electronic devices contain electronic memory configured to store data. As the semiconductor industry has progressed into nanometer technology process nodes in pursuit of higher device density, higher performance, and lower costs, it is desirable to incorporate and merge logic circuits having a variety of functions with non-volatile memory circuits within one chip.

Electronic memory may be volatile memory or non-volatile memory. Volatile memory stores data while it is powered, while non-volatile memory is able to store data when power is removed. Ferroelectric random-access memory (FeRAM) devices are one promising candidate for a next generation non-volatile memory technology. This is because FeRAM devices provide for many advantages, including a fast write time, high endurance, low power consumption, low susceptibility to damage from radiation, and significantly smaller size compared to other kinds of memory cell.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2 is an enlarged cross-sectional view of an embodiment of a dielectric stack in the first semiconductor structure of FIG. 1.

FIG. 3 is an enlarged cross-sectional view of another embodiment of a dielectric stack in the first semiconductor structure of FIG. 1.

DETAILED DESCRIPTION OF THE DISCLOSURE

Figure 1:
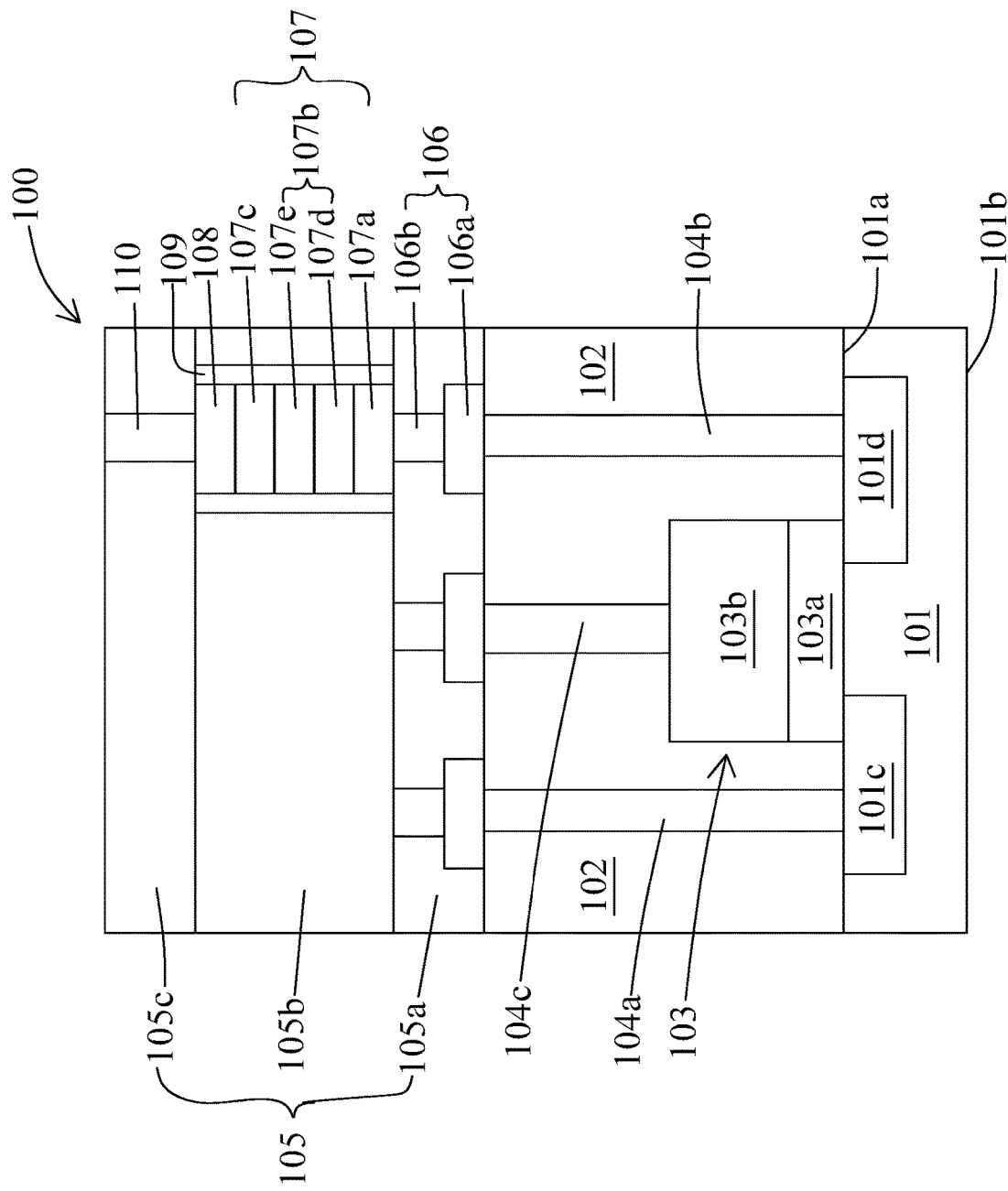
FIG. 1 is a schematic cross-sectional view of a first semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art.

Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In the present disclosure, a semiconductor structure is disclosed. The semiconductor structure includes a ferroelectric random access memory (FeRAM) cell. The FeRAM cell includes a capacitor for data storage. The capacitor includes a pair of electrodes disposed opposite to each other and a dielectric stack between the pair of electrodes. The dielectric stack includes a ferroelectric layer and an electrostrictive layer. Since the electrostrictive layer is incorporated in the dielectric stack, polarization switching of the ferroelectric layer is improved. Further, polarization stability is increased, and data storage retention is also increased. Performance of the FeRAM cell is improved.

FIG. 1 is a schematic cross sectional view of a first semiconductor structure 100 in accordance with some embodiments of the present disclosure. In some embodiments, the first semiconductor structure 100 is a memory device or a part of a memory device. In some embodiments, the first semiconductor structure 100 includes a memory cell. In some embodiments, the memory cell is a non-volatile memory cell. In some embodiments, the memory cell is a FeRAM cell. In some embodiments, the first semiconductor structure 100 includes a substrate 101, a first dielectric layer 102, a transistor 103, a second dielectric layer 105 and a capacitor 107.

In some embodiments, the substrate 101 is a semiconductive substrate. In some embodiments, the substrate 101 includes a silicon substrate, a silicon germanium substrate, or a substrate formed of other semiconductor materials. In some embodiments, the substrate 101 includes silicon, silicon germanium, silicon carbide, or a group III-V semiconductor. In some embodiments, the substrate 101 is a silicon wafer including a p-type substrate and a shallow trench isolation (STI) disposed over the p-type substrate. In some embodiments, a transistor in a metal oxide semiconductor (MOS) structure or complementary MOS structure is subsequently formed over the substrate 101, and the transistor is isolated from other components by the STI. In some embodiments, the substrate 101 may be doped with a p-type or an n-type impurity.

In some embodiments, the substrate 101 includes a first surface 101a and a second surface 101b opposite to the first surface 101a. In some embodiments, the first surface 101a is a front side of the substrate 101, that electrical devices or components are subsequently formed over the first surface 101a. In some embodiments, the second surface 101b is a back side of the substrate 101, that electrical device or component is absent.

In some embodiments, a doped region (101c or 101d) is formed over or in the first surface 101a of the substrate 101. In some embodiments, the doped region (101c or 101d) has a conductivity type different from a conductivity type of the substrate 101. In some embodiments, the doped region (101c or 101d) is in p-type or n-type. In some embodiments, a first doped region 101c and a second doped region 101d are formed over the first surface 101a of the substrate 101. In some embodiments, the first doped region 101c is a source region, and the second doped region 101d is a drain region. In some embodiments, the source region and the drain region may be interchangeable with each other. In some embodiments, the first doped region 101c and the second doped region 101d are disposed opposite to each other.

In some embodiments, the first dielectric layer 102 is disposed over the substrate 101. In some embodiments, the first dielectric layer 102 is disposed over the first surface 101a of the substrate 101. In some embodiments, the first dielectric layer 102 can be in multiple layers configuration and thus can include several dielectric layers stacking over each other. In some embodiments, the first dielectric layer 102 can be referred as an interlayer dielectric (ILD). In some embodiments, the first dielectric layer 102 includes one or more layers of silicon based insulating material, such as $SiO_2$, SiN, SiOC, SiCN, SiOCN or SiON. In some embodiments, a thickness of the first dielectric layer 102 is in a range from about 200 nm to about 1000 nm.

In some embodiments, the transistor 103 is disposed within the first dielectric layer 102. In some embodiments, the transistor 103 is surrounded by the first dielectric layer 102. In some embodiments, the transistor 103 is disposed on an active region of the substrate 101 surrounded by the isolation or STI. In some embodiments, the transistor 103 is a memory transistor. In some embodiments, the transistor 103 is a field effect transistor (FET) or a ferroelectric field effect transistor (FeFET). In some embodiments, the transistor 103 includes a gate structure (103a and 103b), the first doped region 101c and the second doped region 101d. In some embodiments, the gate structure (103a and 103b) is disposed between the first doped region 101c and the second doped region 101d. In some embodiments, the gate structure (103a and 103b) is across a channel region of the substrate 101. In some embodiments, the gate structure (103a and 103b) is a metal gate structure.

In some embodiments, the gate structure (103a and 103b) includes a gate dielectric 103a and a gate electrode 103b disposed over the gate dielectric 103a. In some embodiments, the gate dielectric 103a may include an insulating layer and a ferroelectric layer stacking over the insulating layer. In some embodiments, the insulating layer includes any suitable insulating material such as silicon oxide, silicon nitride or the like. In some embodiments, the ferroelectric layer includes any suitable ferroelectric material such as lead zirconate titanate (PZT), strontium bismuth tantalate (SBT), bismuth lanthanum titanate (BLT), hafnium oxide ($HfO_2$), zirconia ($ZrO_2$), hafnium zirconium oxide (HZO or $Hf_xZr_{(1-x)}O_2$), wurtzite nitride (e.g. aluminum nitride (AlN), gallium nitride (GaN), aluminum scandium nitride (AlScN)) or the like.

Ferroelectric material has a nonlinear relationship between an applied electric field and a stored charge. Electric dipoles are formed in the crystal structure of the ferroelectric material. During operation, a bias voltage may be applied to the first doped region 101c, the second doped region 101d or the gate electrode 103b. The bias voltage is configured to write or read a date into or from the transistor 103. The bias voltage can be applied to cause charge carriers (e.g., electrons and/or holes) to accumulate between the first doped region 101c and the second doped region 101d and generate electric fields across the ferroelectric material. The electric field can change positions of the electric dipoles within the ferroelectric material, depending on the bias voltage. Polarization state affects a threshold voltage of the transistor 103. When a voltage is applied, a current value changes according to the polarization state, thereby storing/reading binary "0" and "1" data.

In some embodiments, the gate electrode 103b includes a work function layer and a metallic layer over the work function layer. In some embodiments, the work function layer has a cross section in a U shape, and the metallic layer is surrounded by the work function layer. In some embodiments, the work function layer includes conductive material such as titanium nitride (TiN), tantalum nitride (TaN) or the like. In some embodiments, the metallic layer includes conductive material such as polysilicon (Poly Si), aluminum, copper, titanium, tantalum, tungsten, cobalt, nickel silicide or the like.

In some embodiments, a spacer is disposed around the gate structure 103. In some embodiments, the spacer includes insulating material such as silicon oxide, silicon nitride or the like. In some embodiments, a silicide layer is formed between the first dielectric layer 102 and the substrate 101 and between the gate electrode 103b and the first dielectric layer 102 for improving electrical conductivity.

In some embodiments, several contact plugs (104a, 104b, 104c) are disposed within and extending through the first dielectric layer 102. In some embodiments, the contact plugs (104a, 104b, 104c) includes conductive material such as titanium nitride, tantalum nitride, aluminum, copper, titanium, tantalum, tungsten, cobalt, nickel silicide or the like. In some embodiments, a first contact plug 104a contacts the first doped region 101c, a second plug 104b contacts the second doped region 101d, and the third contact plug 104c contacts the gate electrode 103b.

In some embodiments, the second dielectric layer 105 is disposed over the first dielectric layer 102. In some embodiments, the second dielectric layer 105 can be in multiple layers configuration and thus can include several dielectric layers stacking over each other. In some embodiments, the second dielectric layer 105 can be referred as an intermetal dielectric (IMD). In some embodiments, the second dielectric layer 105 includes one or more layers of silicon based insulating material, such as $SiO_2$, SiN, SiOC, SiCN, SiOCN or SiON. In some embodiments, the second dielectric layer 105 includes a first layer 105a, a second layer 105b disposed over the first layer 105a, and a third layer 105c disposed over the second layer 105b. In some embodiments, the first layer 105a, the second layer 105b and the third layer 105c may include same or different dielectric materials from each other.

In some embodiments, a conductive structure 106 is disposed within the second dielectric layer 105. In some embodiments, the conductive structure 106 is surrounded by the first layer 105a of the second dielectric layer 105. In some embodiments, the conductive structure 106 is electrically connected to the contact plug (104a, 104b, 104c). In some embodiments, the conductive structure 106 includes conductive material such as titanium nitride, tantalum nitride, aluminum, copper, titanium, tantalum, tungsten, cobalt, nickel silicide or the like. In some embodiments, the conductive structure 106 includes a conductive line 106a extending within the second dielectric layer 105 and a conductive via 106b coupled with the conductive line 106a and extending through the first layer 105a of the second dielectric layer 105. In some embodiments, the conductive via 106b extends orthogonal to the conductive line 106a. In some embodiments, the conductive via 106b is configured to connect to an external circuitry or electrical component.

In some embodiments, the conductive line 106a contacts the first contact plug 104a. In some embodiments, the conductive line 106a is electrically connected to the first doped region 101c through the first contact plug 104a. In some embodiments, the conductive line 106a contacts the second contact plug 104b. In some embodiments, the conductive line 106a is electrically connected to the second doped region 101d through the second contact plug 104b. In some embodiments, the conductive line 106a contacts the third contact plug 104bc In some embodiments, the conductive line 106a is electrically connected to the gate electrode 103b through the third contact plug 104c. In some embodiments, the conductive line 106a connected to the first doped region 101c is a bit line. In some embodiments, the conductive line 106a connected to the gate electrode is a word line. In some embodiments, the conductive line 106a connected to the second doped region 101d is a source line.

In some embodiments, the capacitor 107 is disposed within the second dielectric layer and electrically connected to the transistor 103. In some embodiments, the capacitor 107 is surrounded by the second layer 105b of the second dielectric layer 105. In some embodiments, the capacitor 107 includes a first electrode 107a, a dielectric stack 107b over the first electrode 107a and a second electrode 107c over the dielectric stack 107b. In some embodiments, the first electrode 107a is a bottom electrode of the capacitor 107, and the second electrode 107c is a top electrode of the capacitor 107. In some embodiments, the conductive via 106b extends between the first electrode 107a and the second contact plug 104b of the second doped region 101d.

In some embodiments, the first electrode 107a and the second electrode 107c are disposed opposite to each other. In some embodiments, the first electrode 107a and the second electrode 107c includes conductive material such as titanium nitride, tantalum nitride, aluminum, copper, titanium, tantalum, tungsten, cobalt, nickel silicide or the like. In some embodiments, the first electrode 107a and the second electrode 107c include same or different material. In some embodiments, the first electrode 107a and the second electrode 107c has the same or different thickness. In some embodiments, a thickness of the first electrode 107a is about 10 nm to about 50 nm. In some embodiments, a thickness of the second electrode 107c is about 10 nm to about 50 nm. In some embodiments, the first electrode 107a is disposed over and coupled with the conductive structure 106. In some embodiments, the first electrode 107a contacts the conductive via 106b.

In some embodiments, the dielectric stack 107b is disposed between the first electrode 107a and the second electrode 107c. In some embodiments, the dielectric stack 107b includes several dielectric layers stacking over each other. In some embodiments, a width of the dielectric stack 107b is substantially less than a width of the first electrode 107a and substantially greater than a width of the second electrode 107c. In some embodiments, the dielectric stack 107b includes an electrostrictive layer 107d and a ferroelectric layer 107e. In some embodiments, the capacitor 107 is a FeRAM capacitor. In some embodiments, the capacitor 107 can be any suitable forms of capacitors such as metal ferroelectric metal (MFM), metal ferroelectric insulator metal (MFIM), metal ferroelectric insulator semiconductor metal (MFISM) or any other suitable configurations. Since the electrostrictive layer 107d is incorporated in the dielectric stack 107b, the electrostrictive layer 107d provides increase of phase uniformity of the ferroelectric layer 107e. As such, polarization switching of the ferroelectric layer 107c is improved. Further, polarization stability is increased, data storage retention is also increased, and operation voltage of the FeRAM cell is reduced. Less power is required to flip between polarity states, and speed of read/write operations is increased. Performance of the first semiconductor structure 100 is improved.

In some embodiments, the ferroelectric layer 107e contacts the electrostrictive layer 107d. In some embodiments, the electrostrictive layer 107d is disposed on the first electrode 107a, and the ferroelectric layer 107e is disposed on the electrostrictive layer 107d. In some embodiments, the electrostrictive layer 107d contacts the first electrode 107a, and the ferroelectric layer 107e contacts the second electrode 107c. In some embodiments, the ferroelectric layer 107e is disposed on the first electrode 107a, and the electrostrictive layer 107d is disposed on the ferroelectric layer

107e. In some embodiments, the ferroelectric layer 107e contacts the first electrode 107a, and the electrostrictive layer 107d contacts the second electrode 107c.

In some embodiments, the dielectric stack 107b can include several electrostrictive layers 107d and several ferroelectric layer 107e. The electrostrictive layers 107d and the ferroelectric layer 107e can be stacked in various ways. FIGS. 2 and 3 are enlarged view of the capacitor 107. For example, as shown in FIG. 2, the dielectric stack 107b includes more than one electrostrictive layers 107d, and the ferroelectric layer 107e is disposed between two electrostrictive layers 107d. For example, as shown in FIG. 3, the dielectric stack 107b can include electrostrictive layers 107d and ferroelectric layers 107e alternately disposed with each other. It can be understood that any suitable stacking arrangements of the electrostrictive layers 107d and the ferroelectric layers 107e are within scope of the present disclosure. In some embodiments, each of the electrostrictive layers 107d contacts at least one of the ferroelectric layers 107e.

Referring back to FIG. 1, in some embodiments, the electrostrictive layer 107d has a piezoelectric charge coefficient (d constant $d_{33}$) substantially greater than a d constant of the ferroelectric layer 107e. In some embodiments, the electrostrictive layer 107d has a d constant substantially greater than 5 pico Coulomb/Newton (pC/N). In some embodiments, the electrostrictive layer 107d has the d constant substantially greater than 10 pC/N. In some embodiments, the electrostrictive layer 107d has the d constant substantially greater than 20 pC/N. In some embodiments, the d constant of the electrostrictive layer 107d is about 50 pC/N to about 90 pC/N. In some embodiments, the d constant of the electrostrictive layer 107d is about 100 pC/N to about 300 pC/N, In some embodiments, the d constant of the electrostrictive layer 107d is about 150 pC/N to about 250 pC/N.

In some embodiments, the electrostrictive layer 107d includes dielectric material such as zinc tin oxide ($ZnSnO_3$), barium titanate ($BaTiO_3$), strontium titanate ($SrTiO_3$) or the like. In some embodiments, the electrostrictive layer 107d is free of lead (Pb). In some embodiments, the ferroelectric layer 107e includes dielectric material such as hafnium dioxide ($HfO_2$), hafnium zirconium oxide (HfZrO), hafnium-lanthanum oxide (HfLaO), hafnium aluminate (HfAlO), hafnium silicate (HfSiO) or the like.

In some embodiments, a thickness of the electrostrictive layer 107d is substantially less than a thickness of the ferroelectric layer 107e. In some embodiments, the thickness of the electrostrictive layer 107d is about 1 nm to about 10 nm. In some embodiments, the thickness of the electrostrictive layer 107d is about 1 nm to about 5 nm. In some embodiments, the thickness of the ferroelectric layer 107e is about 5 nm to about 30 nm. In some embodiments, the thickness of the ferroelectric layer 107e is about 10 nm to about 20 nm.

In some embodiments, a hardmask 108 is disposed over the second electrode 107c, the dielectric stack 107b and the first electrode 107a. In some embodiments, the hardmask 108 includes nitride, oxide or any other suitable materials. In some embodiments, the hardmask 108 includes same material as in the electrostrictive layer 107d. In some embodiments, the hardmask 108 and the second electrode 107c include the same or different material from each other. In some embodiments, an isolation 109 surrounds the hardmask 108, the second electrode 107c, the dielectric stack 107b and the first electrode 107a. In some embodiments, the isolation 109 is disposed between the second dielectric layer 105 and the capacitor 107. In some embodiments, the isolation 109 includes nitride or any other suitable materials. In some embodiments, the isolation 109 extends vertically and contacts sidewalls of the hardmask 108, the second electrode 107c, the dielectric stack 107b and the first electrode 107a.

In some embodiments, a second conductive via 110 is disposed within the second dielectric layer 105 and disposed over and contacting the capacitor 107. In some embodiments, the second conductive via 110 contacts the hardmask 108. In some embodiments, the second conductive via 110 extends through the third layer 105c of the second dielectric layer 105 and electrically connects to the capacitor 107. In some embodiments, the second conductive via 110 includes conductive material such as titanium nitride, tantalum nitride, aluminum, copper, titanium, tantalum, tungsten, cobalt, nickel silicide or the like. In some embodiments, the second conductive via 110 is in configuration similar to the conductive via 106b. In some embodiments, the second conductive via 110 is configured to connect to an external circuitry or electrical component.

Figure 4:
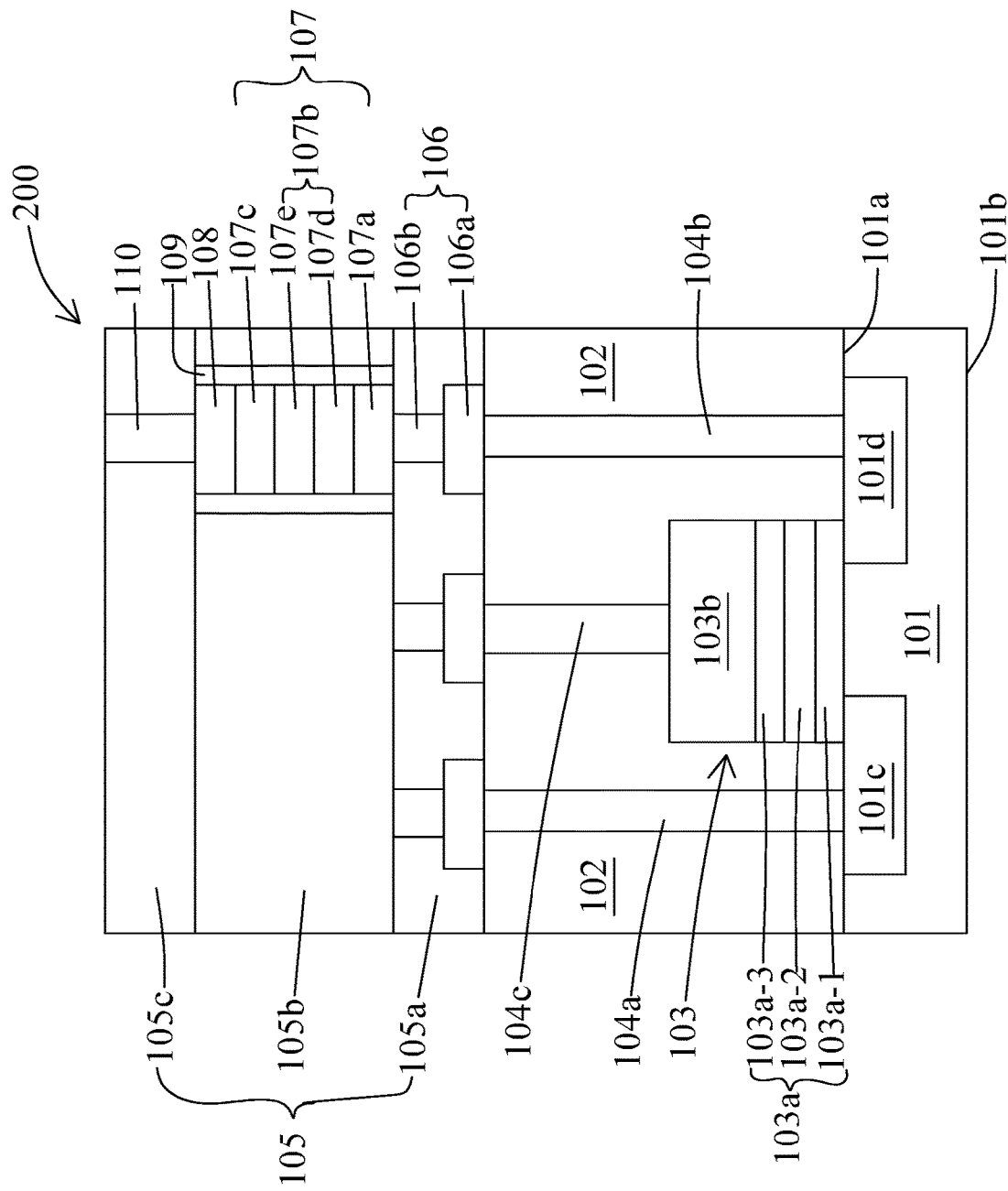
FIG. 4 is a schematic cross-sectional view of a second semiconductor structure in accordance with some embodiments of the present disclosure.

FIG. 4 is a schematic cross sectional view of a second semiconductor structure 200 in accordance with some embodiments of the present disclosure. In some embodiments, the second semiconductor structure 200 is a memory device or a part of a memory device. In some embodiments, the second semiconductor structure 200 includes a memory cell. In some embodiments, the memory cell is a non-volatile memory cell, in some embodiments, the memory cell is a FeRAM cell. In some embodiments, the second semiconductor structure 200 is similar to the first semiconductor structure 100, except the gate dielectric 103a of the second semiconductor structure 200 further includes an electrostrictive layer. In some embodiments, the transistor 103 is a FeFET. In some embodiments, the gate dielectric 103a includes an insulating layer 103a-1, an electrostrictive layer 103a-2 and a ferroelectric layer 103a-3. Since the electrostrictive layer 103a-2 is incorporated in the gate dielectric 103a, polarization switching of the ferroelectric layer 103a-3 is improved. Further, polarization stability is increased, and data storage retention is also increased. Performance of the second semiconductor structure 200 is improved.

In some embodiments, the insulating layer 103a-1, the electrostrictive layer 103a-2 and the ferroelectric layer 103a-3 are stacked over each other. In some embodiments, the electrostrictive layer 103a-2 contacts the ferroelectric layer 103a-3. In some embodiments, the electrostrictive layer 103a-2 is disposed between the insulating layer 103a-1 and the ferroelectric layer 103a-3. It can be understood that any suitable stacking arrangements of the electrostrictive layer 103a-2 and the ferroelectric layer 103a-3 are within scope of the present disclosure. In some embodiments, the ferroelectric layer 103a-3 contacts the gate electrode 103b. In some embodiments, the ferroelectric layer 103a-3 is disposed between the insulating layer 103a-1 and the electrostrictive layer 103a-2. In some embodiments, the electrostrictive layer 103a-2 contacts the gate electrode 103b. In some embodiments, the electrostrictive layer 103a-2 and the ferroelectric layer 103a-3 are in configurations similar to the electrostrictive layer 107d and the ferroelectric layer 107e described above or illustrated in FIGS. 1-3.

Figure 5:
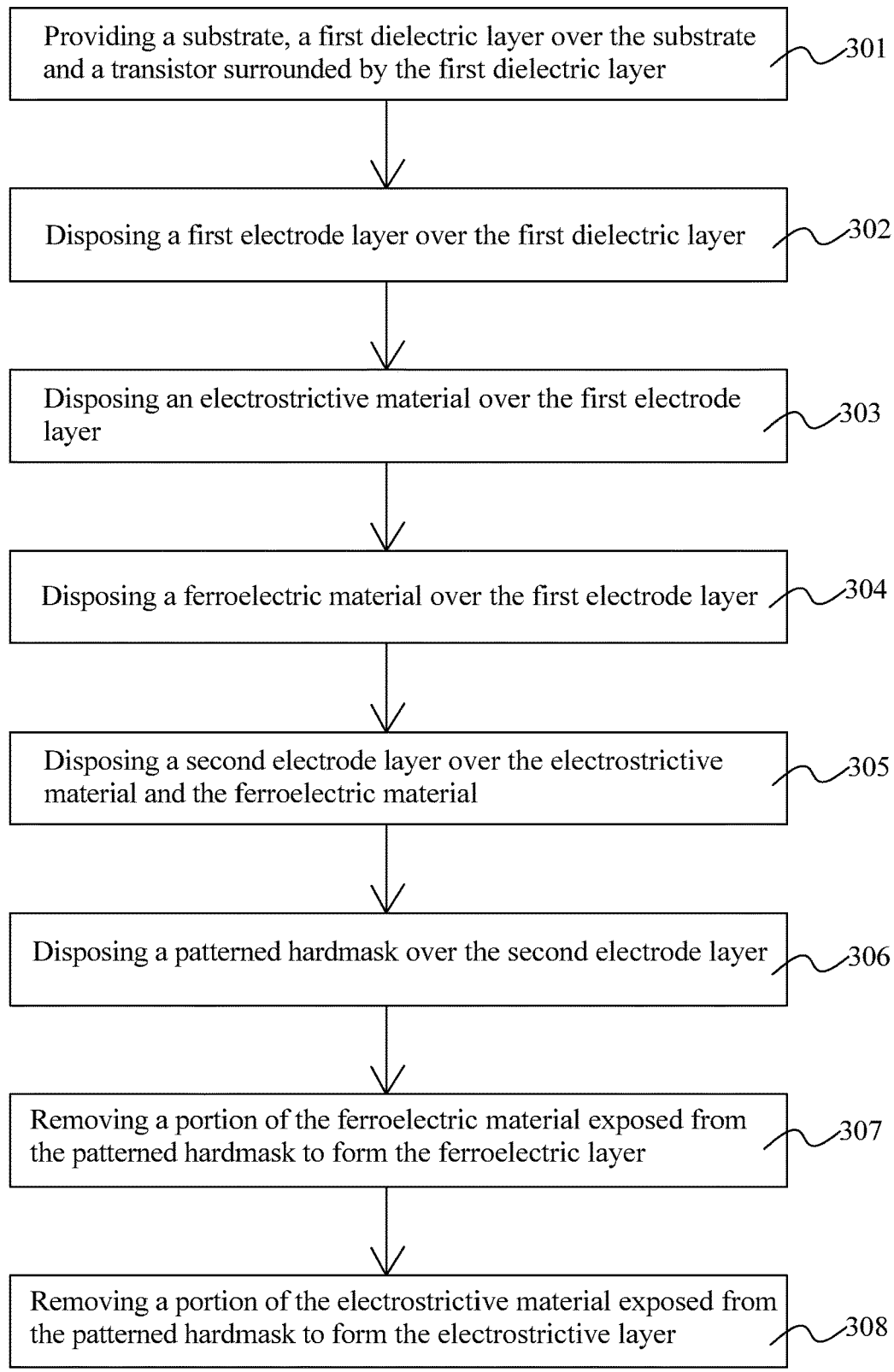
FIG. 5 is a flow diagram of a method of manufacturing a semiconductor structure in accordance with some embodiments of the present disclosure.

In the present disclosure, a method of manufacturing a semiconductor structure is disclosed. In some embodiments, a first semiconductor structure 100 or a second semiconductor structure 200 can be formed by a method 300 illustrated in FIG. 5. The method 300 includes a number of operations and the description and illustration are not deemed as a limitation as the sequence of the operations. The method 300 includes a number of operations (301, 302, 303, 304, 305, 306, 307 and 308).

Figure 6:
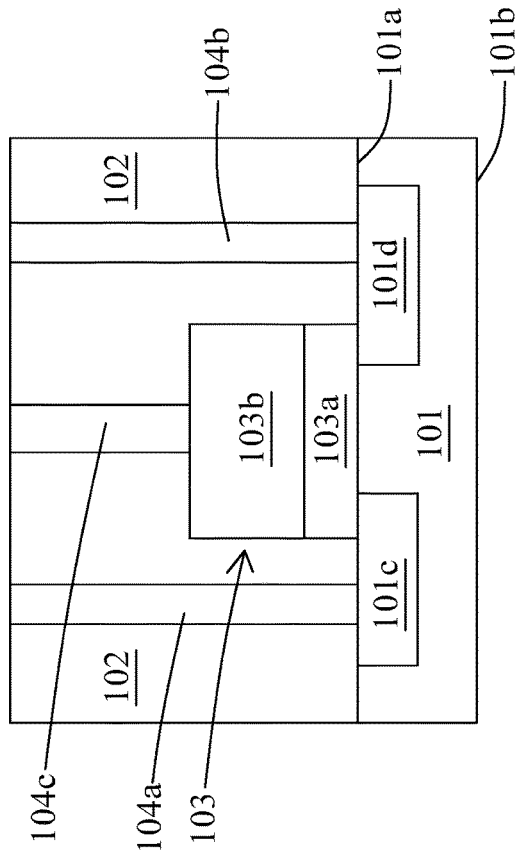
FIGS. 6-16 are schematic views of manufacturing a semiconductor structure by a method of FIG. 5 in accordance with some embodiments of the present disclosure.

In operation 301, a substrate 101, a first dielectric layer 102 and a transistor 103 are provided as shown in FIG. 6. In some embodiments, the substrate 101 is a silicon substrate. In some embodiments, the substrate 101 is in configuration similar to the one described above or illustrated in FIG. 1. In some embodiments, a first doped region 101c and a second doped region 101d are formed in or over the substrate 101. In some embodiments, the first doped region 101c and the second doped region 101d are formed by implantation using predetermined dopants or any other suitable operations. In some embodiments, the first doped region 101c and the second doped region 101d are in configurations similar to those described above or illustrated in FIG. 1.

In some embodiments, a transistor 103 is formed over the substrate 101. In some embodiments, the formation of the transistor 103 includes forming the first doped region 101c and the second doped region 101d, and forming a wile structure (103a and 103b) between the first doped region 101c and the second doped region 101d. In some embodiments, the formation of the gate structure (103a and 103b) includes disposing a gate dielectric 103a and forming a gate electrode 103b over the gate dielectric 103a. In some embodiments, the gate dielectric 103a is disposed by deposition, physical vapor deposition (PVD), chemical vapor deposition (CVD) or any other suitable operations. In some embodiments, the gate electrode 103b is formed by disposing a conductive material over the gate dielectric 103a. In some embodiments, the gate structure (103a and 103b) is in configuration similar to the one described above or illustrated in FIG. 1.

Figure 7:
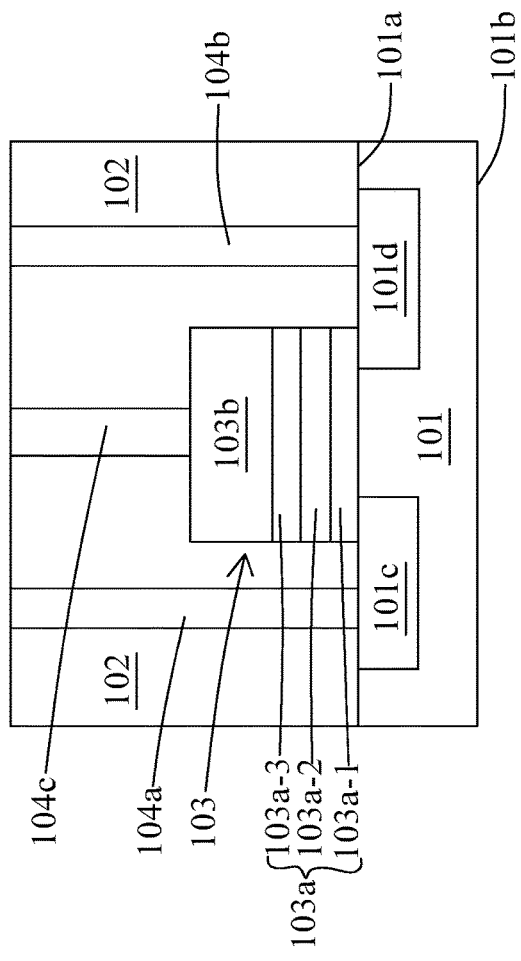

In some embodiments as shown in FIG. 7, the disposing of the gate dielectric 103a includes disposing an insulating layer 103a-1, disposing an electrostrictive layer 103a-2 and disposing a ferroelectric layer 103a-3. In some embodiments, the insulating layer 103a-1, the electrostrictive layer 103a-2 and the ferroelectric layer 103a-3 are disposed by deposition, PVD, CVD or any other suitable operations. In some embodiments, the disposing of the electrostrictive layer 103a-2 is prior to or after the disposing of the ferroelectric layer 103a-3. In some embodiments, the insulating layer 103a-1, the electrostrictive layer 103a-2 and the ferroelectric layer 103a-3 are in configurations similar to those described above or illustrated in FIG. 4. For simplicity and clarity, the following description only directs to the operations for forming the first semiconductor structure 100 as shown in FIG. 1. However, it can be understood that the operations can be similarly applied to form the second semiconductor structure 200 as shown in FIG. 4.

Referring back to FIG. 6, the first dielectric layer 102 is disposed over the substrate 101 and the transistor 103. In some embodiments, the first dielectric layer 102 is disposed by deposition, PVD, CVD, spinning or any other suitable operations. In some embodiments, the first dielectric layer 102 surrounds the transistor 103. In some embodiments, the first dielectric layer 102 is an ILD layer. In some embodiments, the first dielectric layer 102 is in configuration similar to the one described above or illustrated in FIG. 1.

In some embodiments, several contact plugs (104a, 104b, 104c) are formed within the first dielectric layer 102. In some embodiments, the contact plug (104a, 104b, 104c) is formed by removing a portion of the first dielectric layer 102 to form an opening and disposing a conductive material into the opening. In some embodiments, the contact plugs (104a, 104b, 104c) are formed separately or simultaneously. In some embodiments, the contact plugs (104a, 104b, 104c) are in configurations similar to those described above or illustrated in FIG. 1.

Figure 8:
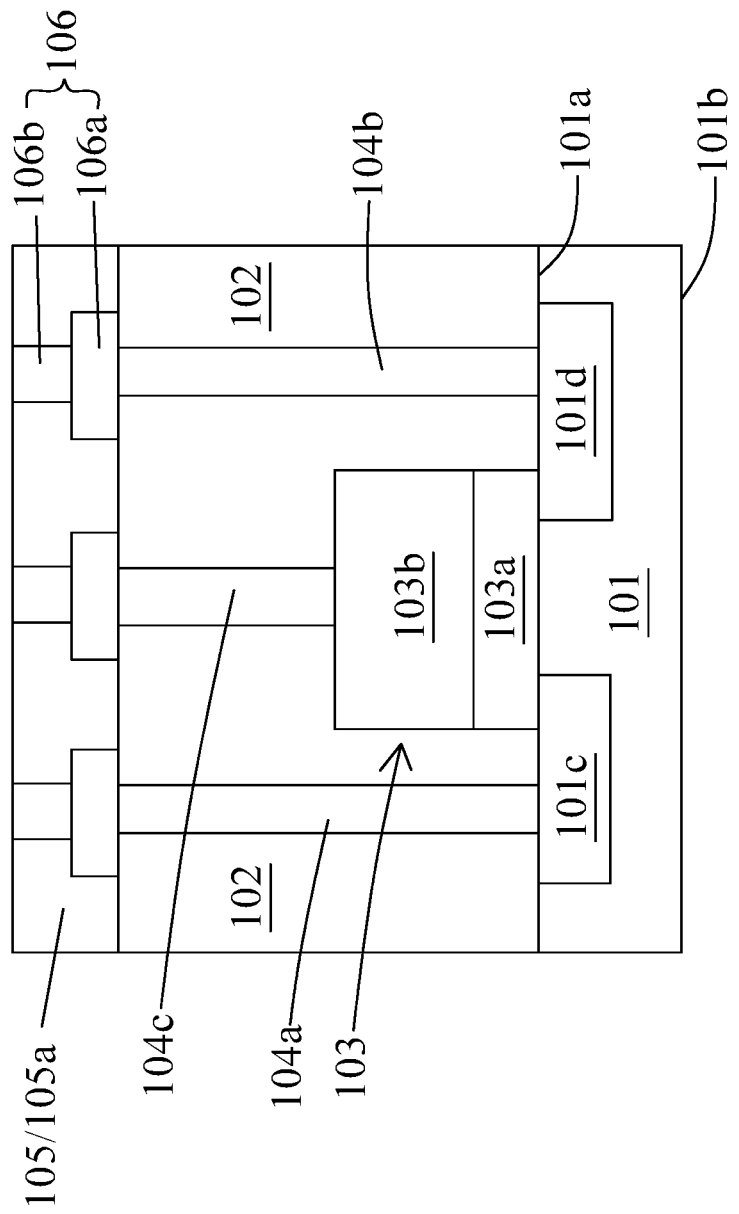

In some embodiments as shown in FIG. 8, a first layer 105a of a second dielectric layer 105 is disposed over the first dielectric layer 102 after the operation 301. In some embodiments, the first layer 105a is disposed by deposition, CVD, PVD or any other suitable operations. In some embodiments, a conductive structure 106 is formed within the first layer 105a. In some embodiments, the conductive structure 106 can be formed by removing a portion of the first layer 105a to form an opening and then disposing a conductive material into the opening. In some embodiments, the first layer 105a and the conductive structure 106 are in configurations similar to those described above or illustrated in FIG. 1.

Figure 9:
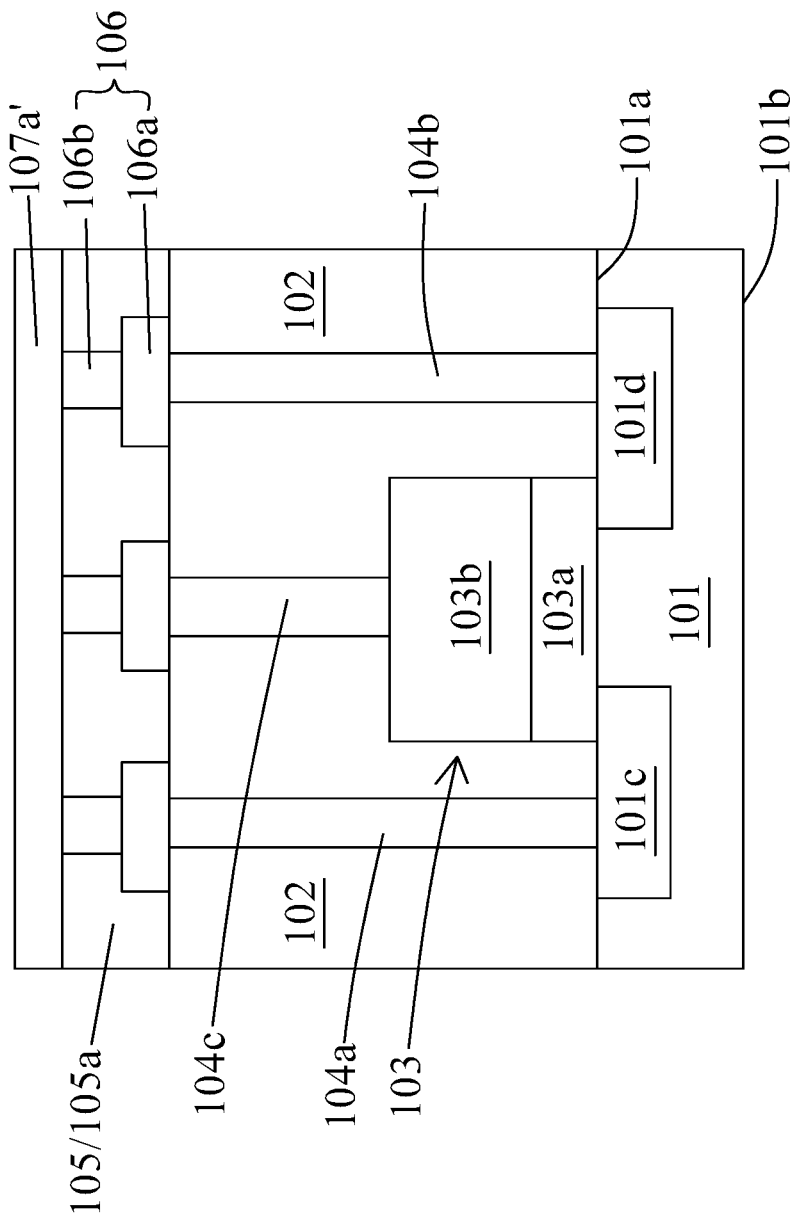

In operation 302, a first electrode layer 107a' is disposed over the first dielectric layer 102 as shown in FIG. 9. In some embodiments, the disposing of the first electrode layer 107a' includes disposing a conductive material over the first layer 105a of the second dielectric layer 105. In some embodiments, the first electrode layer 107a' is disposed by electroplating, sputtering or any other suitable operations. In some embodiments, the first electrode layer 107a' includes conductive material such as titanium nitride, tantalum nitride, aluminum, copper, titanium, tantalum, tungsten, cobalt, nickel silicide or the like. In some embodiments, the first electrode layer 107a' is disposed over and coupled with the conductive structure 106.

Figure 10:
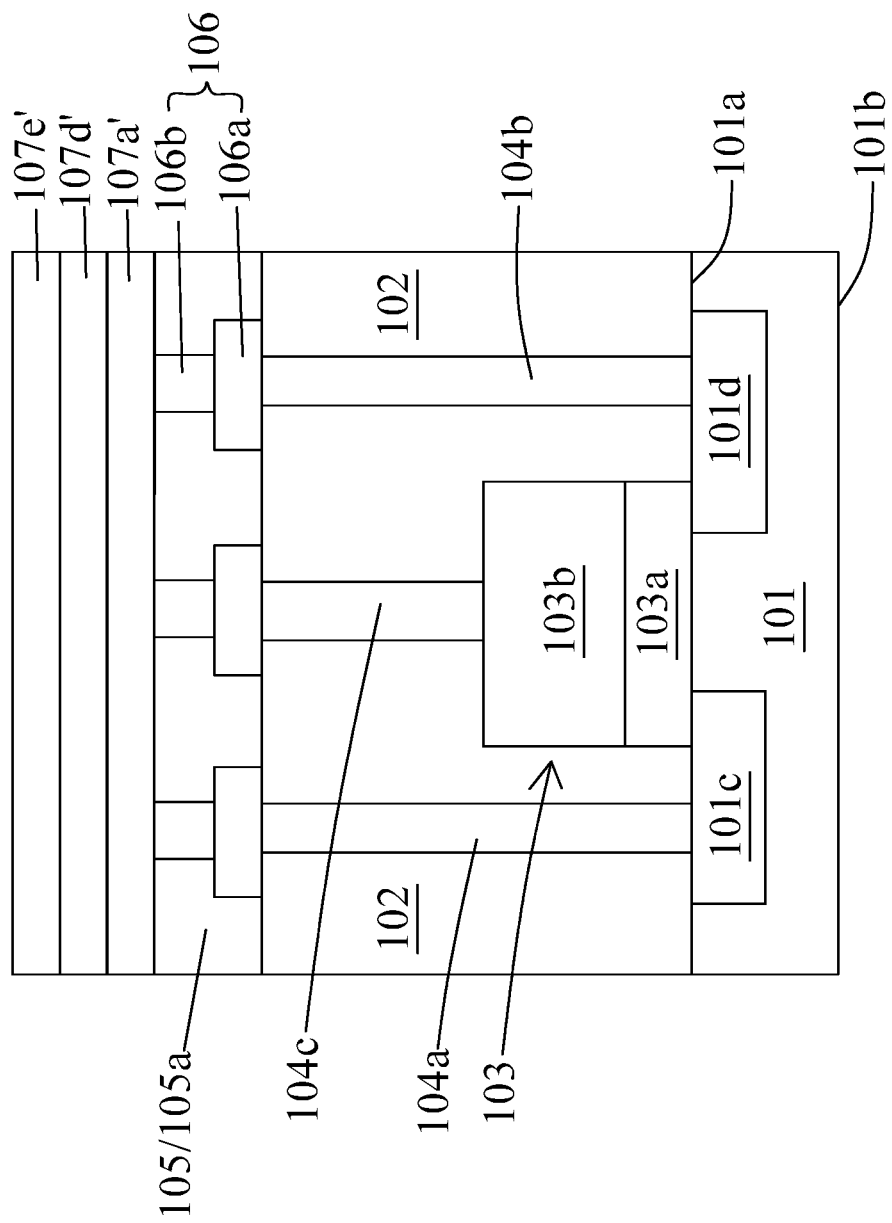

In operation 303, an electrostrictive material 107d' is disposed over the first electrode layer 107a' as shown in FIG. 10. In some embodiments, the electrostrictive material 107d' is disposed by deposition, CVD, PVD or any other suitable operations. In some embodiments, the electrostrictive material 107d' includes dielectric material such as zinc tin oxide ($ZnSnO_3$), barium titanate ($BaTiO_3$), strontium titanate (SrTiO3) or the like. In some embodiments, the electrostrictive layer 107d is free of lead (Pb). In some embodiments, the electrostrictive material 107d' has a d constant substantially greater than 5 pC/N. In some embodiments, the electrostrictive material 107d' has the d constant substantially greater than 10 pC/N. In some embodiments, the electrostrictive material 107d' has the d constant substantially greater than 20 pC/N. In some embodiments, the d constant of the electrostrictive material 107d; is about 50 pC/N to about 90 pC/N. In some embodiments, the d constant of the electrostrictive material 107d' is about 100 pc/N to about 300 pC/N. In some embodiments, the d constant of the electrostrictive material 107d' is about 150 pC/N to about 250 pC/N. In some embodiments, a thickness of the electrostrictive material 107d' is about 1 nm to about 10 nm. In some embodiments, the thickness of the electrostrictive material 107d' is about 1 nm to about 5 nm.

In operation 304, a ferroelectric material 107e' is disposed over the first electrode layer 107a' as shown in FIG. 10. In some embodiments, the ferroelectric material 107e' is disposed by deposition, CVD, PVD or any other suitable operations. In some embodiments, the ferroelectric material 107e' includes dielectric material such as hafnium dioxide ($HfO_2$), hafnium zirconium oxide (HfZrO), hafnium-lanthanum oxide (HfLaO), hafnium aluminate (HfAlO), hafnium silicate (HfSiO) or the like. In some embodiments, a thickness of the ferroelectric material 107e' is about 5 nm to about 30 nm. In some embodiments, the thickness of the ferroelectric material 107e' is about 10 nm to about 20 nm.

In some embodiments, the disposing of the ferroelectric material 107e' (the operation 304) is performed after the disposing of the electrostrictive material 107d' (the operation 303). In some embodiments, the electrostrictive material 107d' is disposed between the first electrode layer 107a' and the ferroelectric material 107e'. In some embodiments, the disposing of the ferroelectric material 107e' (the operation 304) is performed before the disposing of the electrostrictive material 107d' (the operation 303). In some embodiments, the ferroelectric material 107e' is disposed between the first electrode layer 107a' and the electrostrictive material 107d'. In some embodiments, the thickness of the electrostrictive material 107d' is substantially less than the thickness of the ferroelectric material 107e'.

Figure 11:
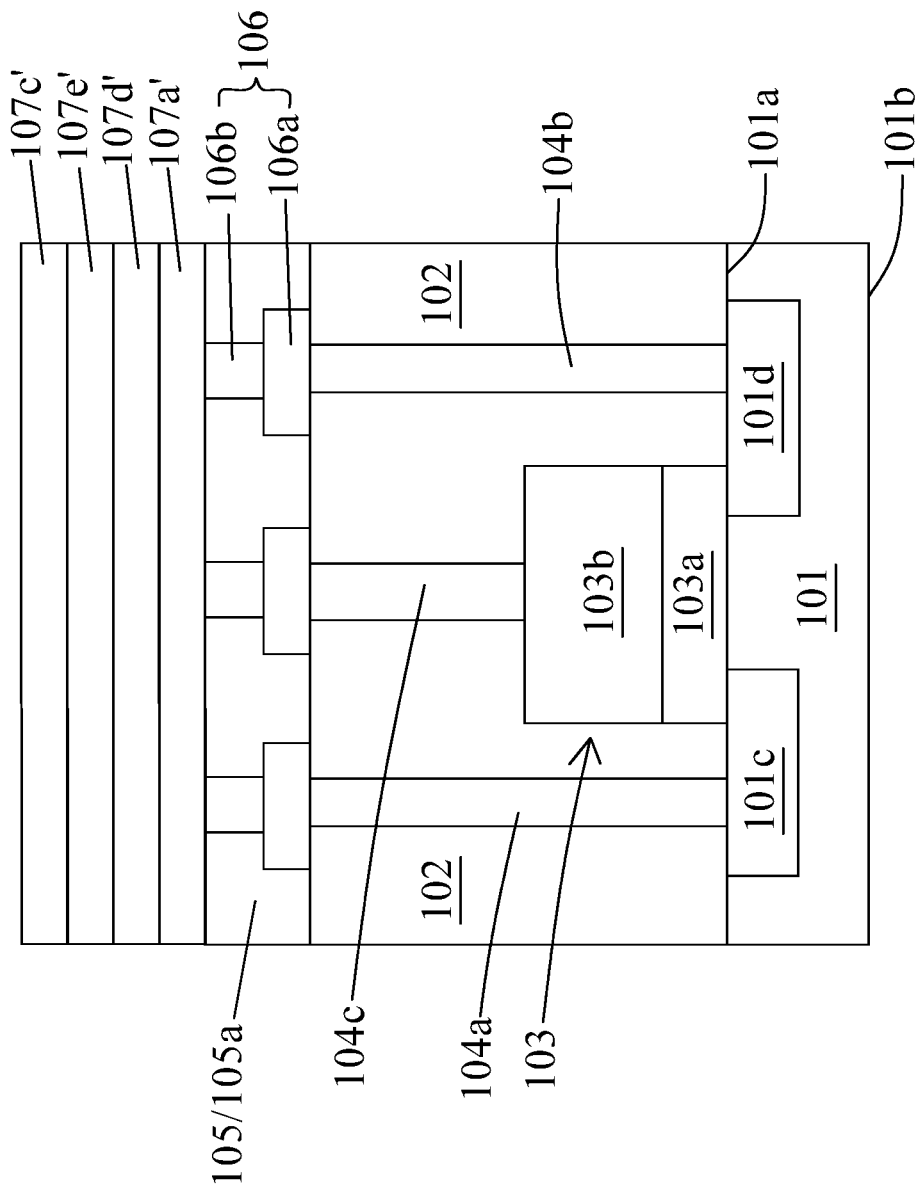

In operation 305, a second electrode layer 107c' is disposed over the electrostrictive material 107d' and the ferroelectric material 107e as shown in FIG. 11. In some embodiments, the disposing of the second electrode layer 107c' includes disposing a conductive material over the electrostrictive material 107d' and the ferroelectric material 107e'. In some embodiments, the second electrode layer 107c; is disposed by electroplating, sputtering or any other suitable operations. In some embodiments, the second electrode layer 107c' includes conductive material such as titanium nitride, tantalum nitride, aluminum, copper, titanium, tantalum, tungsten, cobalt, nickel silicide or the like.

Figure 12:
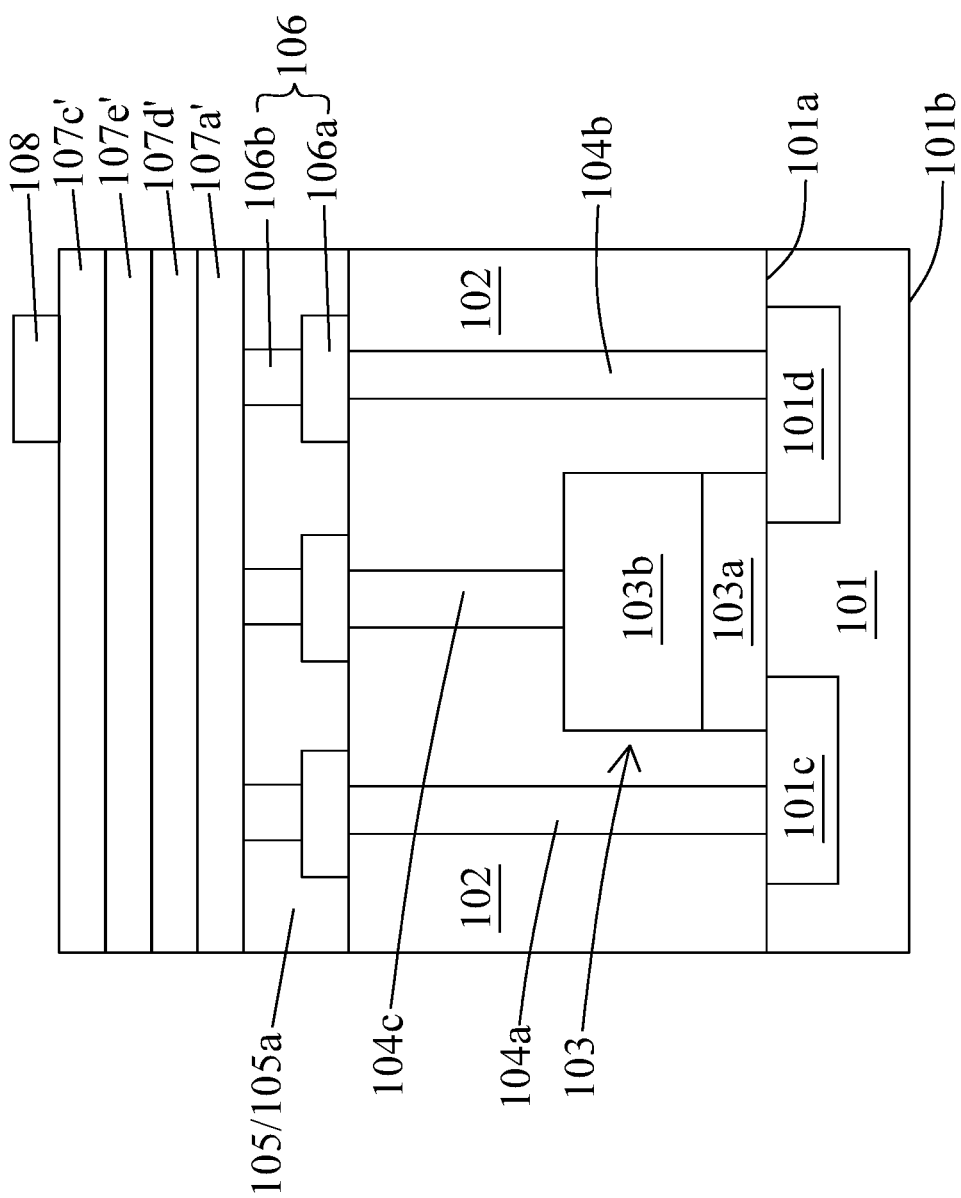

In operation 306, a patterned hardmask 108 is disposed over the second electrode layer 107c' as shown in FIG. 12. In some embodiments, the patterned hardmask 108 partially covers the second electrode layer 107c'. In some embodiments, the patterned hardmask 108 is disposed by disposing a hard mask layer over the second electrode layer 107c' and removing some portions of the hard mask layer to form the patterned hardmask 108. In some embodiments, the patterned hardmask 108 includes nitride, oxide, tetra ethyl-ortho-silicate (TEOS) or any other suitable materials. In some embodiments, the patterned hardmask 108 is configured to prevent etching of materials under the patterned hardmask 108, in some embodiments, the patterned hardmask 108 is in configuration similar to the hardmask 108 described above or illustrated in FIG. 1.

Figure 13:
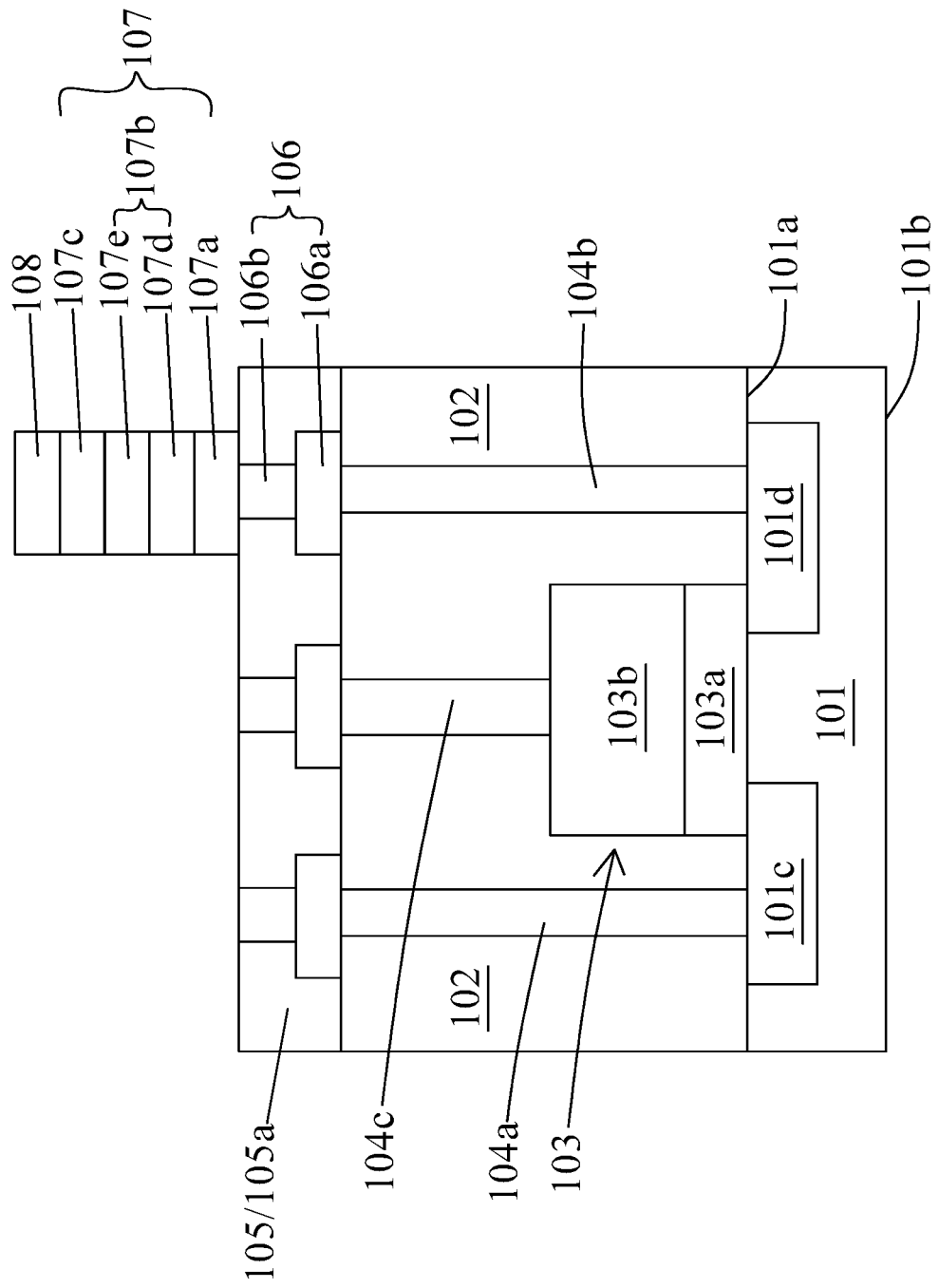

In some embodiments, a portion of the second electrode layer 107c' exposed from the patterned hardmask 108 is removed to form a second electrode 107c as shown in FIG. 13. In some embodiments, the exposed portion of the second electrode layer 107c' is removed by photolithography, etching or any other suitable operations. In some embodiments, the second electrode 107c is in configuration similar to the one described above or illustrated in FIG. 1.

In operation 307, a portion of the ferroelectric material 107e' exposed from the patterned hardmask 108 is removed to form a ferroelectric layer 107e as shown in FIG. 13. In some embodiments, the exposed portion of the ferroelectric material 107e' is removed by photolithography, etching or any other suitable operations. In some embodiments, the ferroelectric layer 107e is in configuration similar to the one described above or illustrated in FIG. 1. In some embodiments, the ferroelectric layer 107e is in configuration similar to the hardmask 108 described above or illustrated in FIG. 1.

In operation 308, a portion of the electrostrictive material 107d' exposed from the patterned hardmask 108 is removed to form an electrostrictive layer 107d as shown in FIG. 13. In some embodiments, the exposed portion of the electrostrictive material 107d' is removed by photolithography, etching or any other suitable operations. In some embodiments, the electrostrictive layer 107d is in configuration similar to the one described above or illustrated in FIG. 1. In some embodiments, the electrostrictive layer 107d is in configuration similar to the hardmask 108 described above or illustrated in FIG. 1.

In some embodiments, the ferroelectric material 107e' is disposed between the first electrode layer 107a' and the electrostrictive material 107d', and therefore the removal of the exposed portion of the electrostrictive material 107d' (the operation 308) is performed before the removal of the exposed portion of the ferroelectric material 107e' (the operation 307). In some embodiments, the electrostrictive material 107d' is disposed between the first electrode layer 107a' and the ferroelectric material 107e', and therefore the removal of the exposed portion of the electrostrictive material 107d' (the operation 308) is performed after the removal of the exposed portion of the ferroelectric material 107e' (the operation 307). In some embodiments, the removal of the exposed portion of the ferroelectric material 107e' (the operation 307) and the removal of the exposed portion of the electrostrictive material 107d' (the operation 308) can be performed simultaneously or separately.

In some embodiments, a portion of the first electrode layer 107a' exposed from the patterned hardmask 108 is removed to form a first electrode 107a as shown in FIG. 13. In some embodiments, the exposed portion of the first electrode layer 107a' is removed by photolithography, etching or any other suitable operations. In some embodiments, the first electrode 107a c is in configuration similar to the one described above or illustrated in FIG. 1. In some embodiments, a capacitor 107 is formed after the removal of the exposed portion of the first electrode layer 107a', the removal of the exposed portion of the electrostrictive material 107d', the removal of the exposed portion of the ferroelectric material 107e' and the removal of the exposed portion of the second electrode layer 107c'.

Figure 14:
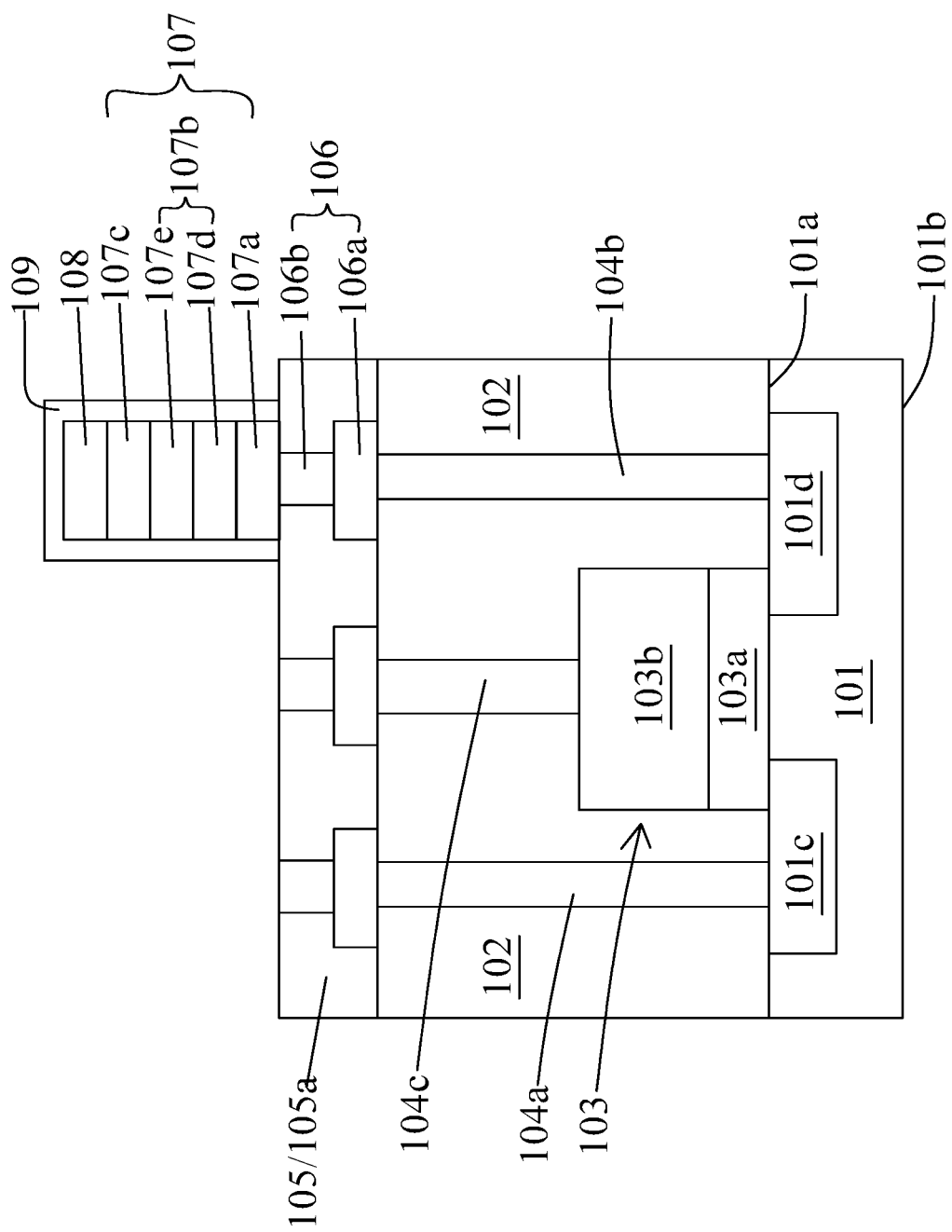

In some embodiments as shown in FIG. 14, an isolation 109 is disposed after the operations 307 and 308 so as to encapsulate the first electrode 107a, the electrostrictive layer 107d, the ferroelectric layer 107e and the second electrode 107c. In some embodiments, the isolation 109 is disposed by spinning, deposition or any other suitable operations. In some embodiments, the isolation 109 is in configuration similar to the one described above or illustrated in FIG. 1.

Figure 15:
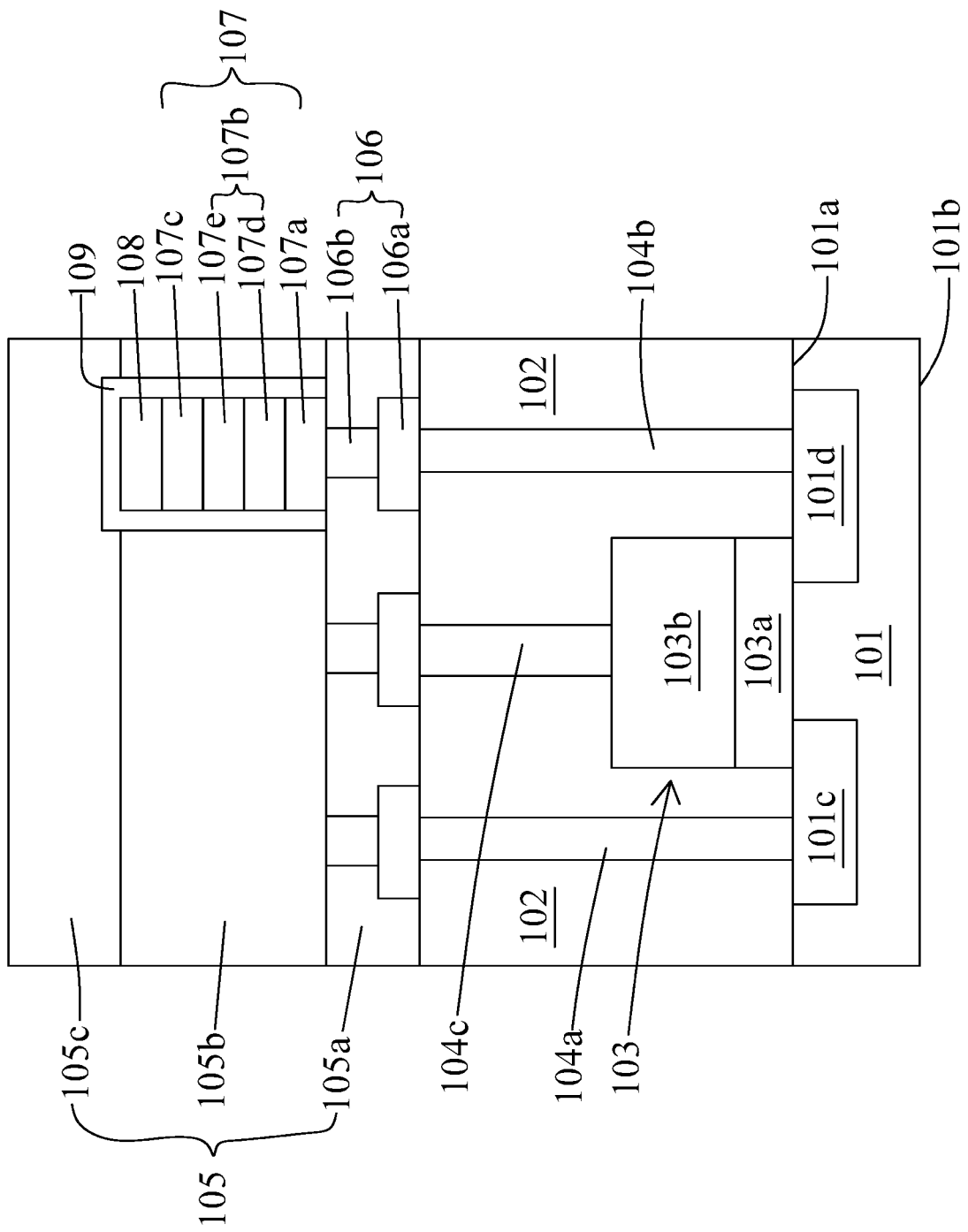

In some embodiments as shown in FIG. 15, a second layer 105b and a third layer 105c of the second dielectric layer 105 is disposed over the first layer 105a after the formation of the isolation 109. In some embodiments, the second layer 105b surrounds the capacitor 107, the patterned hardmask 108 and the isolation 109. In some embodiments, the third layer 105c is disposed over the capacitor 107, the patterned hardmask 108 and the isolation 109. In some embodiments, the second layer 105b and the third layer 105c are disposed by deposition, CVD, PVD or any other suitable operations.

Figure 16:
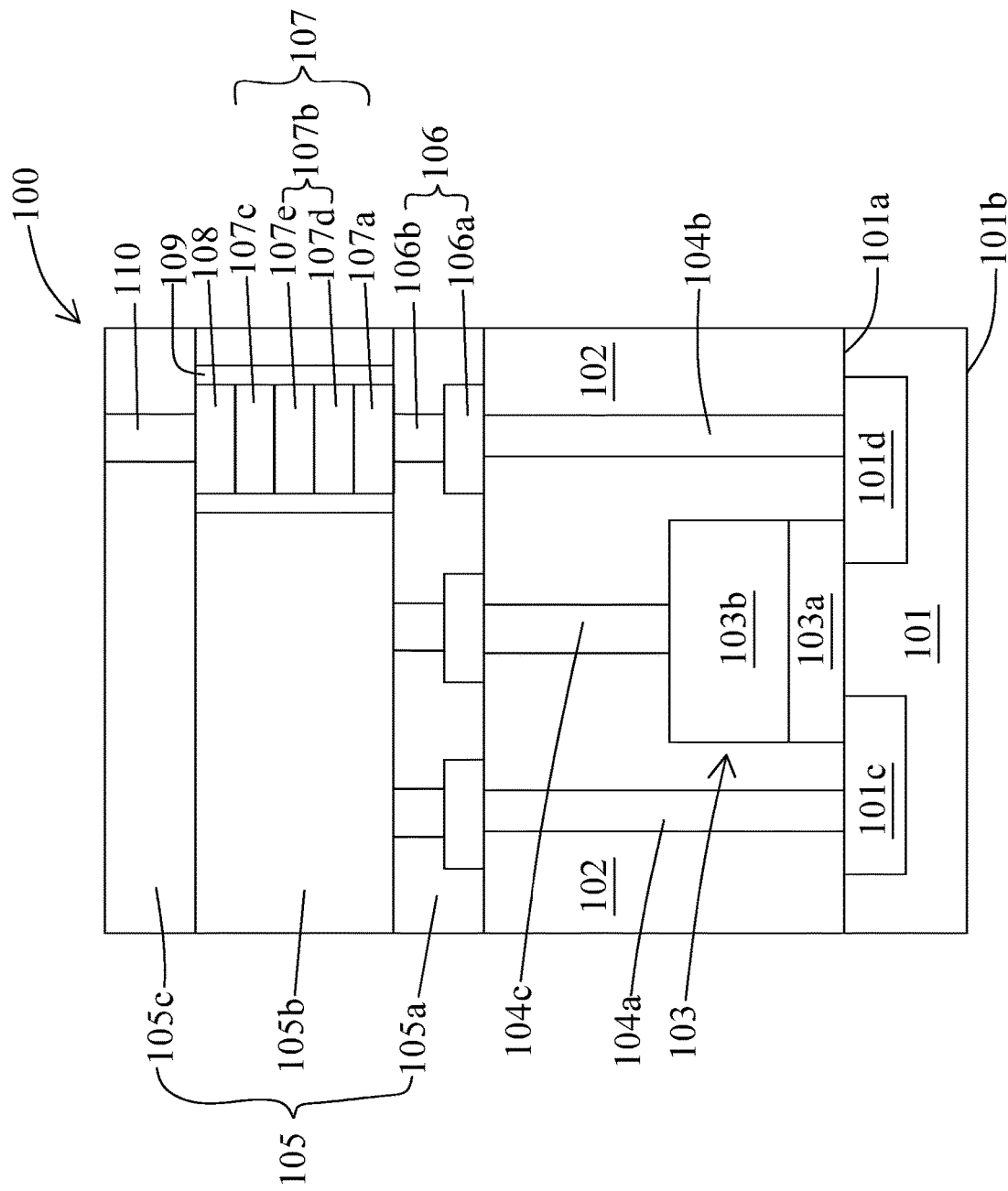

In some embodiments as shown in FIG. 16, a top portion of the isolation 109 disposed on the patterned hardmask 108 is removed, and a portion of the third layer 105c is also removed to form an opening above the capacitor 107, and a conductive material is disposed into the opening to form a second conductive via 110. In some embodiments, the second conductive via 110 contacts the hardmask 108. In some embodiments, the second conductive via 110 electrically connects to the capacitor 107. In some embodiments, the second conductive via 110 is in configuration similar to the one described above or illustrated in FIG. 1. In some embodiments, a first semiconductor structure 100 described above or illustrated in FIG. 1 is formed.

In the present disclosure, a semiconductor structure includes a substrate; a first dielectric layer disposed over the substrate; a transistor disposed within the first dielectric layer; a second dielectric layer disposed over the first dielectric layer; and a capacitor disposed within the second dielectric layer and electrically connected to the transistor, wherein the capacitor includes a first electrode, a dielectric stack disposed over the first electrode, and a second electrode disposed over the dielectric stack, the dielectric stack includes a ferroelectric layer and an electrostrictive layer.

In some embodiments, the ferroelectric layer contacts the electrostrictive layer. In some embodiments, the electrostrictive layer has a piezoelectric charge coefficient (d constant $d_{33}$) substantially greater than a piezoelectric charge coefficient (d constant $d_{33}$) of the ferroelectric layer. In some embodiments, the electrostrictive layer has a piezoelectric charge coefficient (d constant $d_{33}$) substantially greater than 5 pico Coulomb/Newton (pC/N). In some embodiments, the electrostrictive layer is disposed on the first electrode, and the ferroelectric layer is disposed on the electrostrictive layer. In some embodiments, the ferroelectric layer contacts the second electrode.

In some embodiments, the ferroelectric layer is disposed on the first electrode, and the electrostrictive layer is disposed on the ferroelectric layer. In some embodiments, the electrostrictive layer contacts the second electrode. In some embodiments, the semiconductor structure further includes a first conductive via disposed within the second dielectric layer and extending between the first electrode and a contact plug of a doped region of the transistor; a second conductive via disposed within the second dielectric layer and disposed over and contacting the capacitor. In some embodiments, the electrostrictive layer is free of lead (Pb). In some embodiments, a thickness of the electrostrictive layer is substantially less than a thickness of the ferroelectric layer. In some embodiments, a thickness of the electrostrictive layer is about film to about 5 nm.

In some embodiments, a semiconductor structure includes a substrate including a doped region; a first dielectric layer disposed over the substrate; a gate structure surrounded by the first dielectric layer and partially disposed over the doped region; a second dielectric layer disposed over the first dielectric layer; a conductive via disposed over and electrically connected to the doped region; and a capacitor surrounded by the second dielectric layer and disposed over and electrically connected to the conductive via, wherein the capacitor includes a first electrode over the conductive via, a dielectric stack disposed over the first electrode, and a second electrode disposed over the dielectric stack, the dielectric stack includes a plurality of ferroelectric layers and a plurality of electrostrictive layers.

In some embodiments, the plurality of ferroelectric layers and the plurality of electrostrictive layers are alternately disposed. In some embodiments, each of the plurality of electrostrictive layers contacts at least one of the plurality of ferroelectric layers. In some embodiments, the semiconductor structure further includes a contact plug extending through the first dielectric layer, contacted with the doped region and electrically connected to the conductive via; an isolation surrounding the dielectric stack and the second electrode.

In some embodiments, a method of manufacturing a semiconductor structure includes providing a substrate, a first dielectric layer over the substrate and a transistor surrounded by the first dielectric layer; disposing a first electrode layer over the first dielectric layer; disposing an electrostrictive material over the first electrode layer; disposing a ferroelectric material over the first electrode layer; disposing a second electrode layer over the electrostrictive material and the ferroelectric material; disposing a patterned hardmask over the second electrode layer; removing a portion of the ferroelectric material exposed from the patterned hardmask to form the ferroelectric layer; and removing a portion of the electrostrictive material exposed from the patterned hardmask to form the electrostrictive layer.

In some embodiments, the disposing of the electrostrictive material is performed before or after the disposing of the ferroelectric material. In some embodiments, the removal of the portion of the electrostrictive material and the removal of the portion of the ferroelectric material are performed simultaneously or separately. In some embodiments, the method further includes removing a portion of the first electrode layer exposed from the patterned hardmask to form a first electrode; removing a portion of the second electrode layer exposed from the patterned hardmask to form a second electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a first dielectric layer disposed over the substrate;
a transistor disposed within the first dielectric layer;
a second dielectric layer disposed over the first dielectric layer; and
a capacitor disposed within the second dielectric layer and electrically connected to the transistor,
wherein the capacitor includes a first electrode, a dielectric stack disposed over the first electrode, and a second electrode disposed over the dielectric stack, the dielectric stack includes a ferroelectric layer and an electrostrictive layer.

2. The semiconductor structure of claim 1, wherein the ferroelectric layer contacts the electrostrictive layer.

3. The semiconductor structure of claim 1, wherein the electrostrictive layer has a piezoelectric charge coefficient (d constant $d_{33}$) substantially greater than a piezoelectric charge coefficient (d constant $d_{33}$) of the ferroelectric layer.

4. The semiconductor structure of claim 1, wherein the electrostrictive layer has a piezoelectric charge coefficient (d constant $d_{33}$) substantially greater than 5 pico Coulomb/Newton (pC/N).

5. The semiconductor structure of claim 1, wherein the electrostrictive layer is disposed on the first electrode, and the ferroelectric layer is disposed on the electrostrictive layer.

6. The semiconductor structure of claim 5, wherein the ferroelectric layer contacts the second electrode.

7. The semiconductor structure of claim 1, wherein the ferroelectric layer is disposed on the first electrode, and the electrostrictive layer is disposed on the ferroelectric layer.

8. The semiconductor structure of claim 7, wherein the electrostrictive layer contacts the second electrode.

9. The semiconductor structure of claim 1, further comprising:
- a first conductive via disposed within the second dielectric layer and extending between the first electrode and a contact plug of a doped region of the transistor; and
- a second conductive via disposed within the second dielectric layer and disposed over and contacting the capacitor.

10. The semiconductor structure of claim 1, wherein the electrostrictive layer is free of lead (Pb).

11. The semiconductor structure of claim 1, wherein a thickness of the electrostrictive layer is substantially less than a thickness of the ferroelectric layer.

12. The semiconductor structure of claim 1, wherein a thickness of the electrostrictive layer is about 1nm to about 5 nm.

13. A semiconductor structure, comprising:
- a substrate including a doped region;
- a first dielectric layer disposed over the substrate;
- a gate structure surrounded by the first dielectric layer and partially disposed over the doped region;
- a second dielectric layer disposed over the first dielectric layer;
- a conductive via disposed over and electrically connected to the doped region; and
- a capacitor surrounded by the second dielectric layer and disposed over and electrically connected to the conductive via, wherein the capacitor includes a first electrode over the conductive via, a dielectric stack disposed over the first electrode, and a second electrode disposed over the dielectric stack, the dielectric stack includes a plurality of ferroelectric layers and a plurality of electrostrictive layers.

14. The semiconductor structure of claim 13, wherein the plurality of ferroelectric layers and the plurality of electrostrictive layers are alternately disposed.

15. The semiconductor structure of claim 13, wherein each of the plurality of electrostrictive layers contacts at least one of the plurality of ferroelectric layers.

16. The semiconductor structure of claim 13, further comprising:
- a contact plug extending through the first dielectric layer, contacted with the doped region and electrically connected to the conductive via; and
- an isolation surrounding the dielectric stack and the second electrode.

17. A semiconductor structure, comprising:
- a substrate;
- a gate structure disposed over the substrate, wherein the gate structure further comprises a gate dielectric stack and a gate electrode over the gate dielectric stack;
- a first dielectric layer disposed over the substrate and the gate structure;
- a second dielectric layer disposed over the first dielectric layer; and
- a capacitor disposed within the second dielectric layer, wherein the capacitor includes a first electrode, a capacitor dielectric stack disposed over the first electrode, and a second electrode disposed over the capacitor dielectric stack, wherein each of the gate dielectric stack and the capacitor dielectric stack comprises a ferroelectric layer and an electrostrictive layer.

18. The semiconductor structure of claim 17, wherein the gate dielectric stack further comprises an insulating layer, and the electrostrictive layer of the gate dielectric stack is disposed between the insulating layer and the ferroelectric layer of the gate dielectric stack.

19. The semiconductor structure of claim 17, wherein the electrostrictive layer of the capacitor dielectric stack is disposed on the first electrode, and the ferroelectric layer of the capacitor dielectric stack is disposed on the electrostrictive layer of the capacitor dielectric stack.

20. The semiconductor structure of claim 17, wherein the ferroelectric layer of the gate dielectric stack is in contact with the gate electrode, and the ferroelectric layer of the capacitor dielectric stack is in contact with the second electrode or the first electrode.

* * * * *